(12) United States Patent
Sadygov et al.

(10) Patent No.: US 8,742,543 B2
(45) Date of Patent: Jun. 3, 2014

(54) MICROCHANNEL AVALANCHE PHOTODIODE (VARIANTS)

(76) Inventors: Ziraddin Yagub-Ogly Sadygov, Dubna (RU); Abdelmounairne Faouzi Zerrouk, Singapore (SG)

( * ) Notice: Subject to any disclaimer, the term of this patent is extended or adjusted under 35 U.S.C. 154(b) by 946 days.

(21) Appl. No.: 12/034,603

(22) Filed: Feb. 20, 2008

(65) Prior Publication Data

US 2009/0050934 A1 Feb. 26, 2009

Related U.S. Application Data

(60) Provisional application No. 60/890,750, filed on Feb. 20, 2007.

(51) Int. Cl.
*H01L 31/00* (2006.01)

(52) U.S. Cl.
USPC ........... 257/603; 257/431; 257/438; 257/439; 257/461; 257/E31.063; 257/E31.116

(58) Field of Classification Search
USPC ......... 257/438, 186, 199, 481, 589, 603, 184, 257/E31.063, E31.116, 439, 431, 461
See application file for complete search history.

(56) References Cited

U.S. PATENT DOCUMENTS

| | | | |
|---|---|---|---|
| 4,700,209 A | 10/1987 | Webb | |
| 4,837,174 A | 6/1989 | Peterson | |
| 6,222,209 B1 | 4/2001 | Antich et al. | |
| 6,353,238 B2 * | 3/2002 | Antich et al. | 257/186 |
| 2001/0022368 A1 * | 9/2001 | Antich et al. | 257/186 |

FOREIGN PATENT DOCUMENTS

| | | |
|---|---|---|
| RU | 1702831 A1 | 6/1997 |
| RU | 2102821 C1 | 1/1998 |
| RU | 2105388 C1 | 2/1998 |
| RU | 2142175 C1 | 11/1999 |
| RU | 2294035 C2 | 2/2007 |

OTHER PUBLICATIONS

Supplemental European Search Report Application No. EP07794024 completed Jun. 21, 2013.
Z. Sadygov et al., "Three advanced designs of avalanche micro-pixel photodiodes: their history of development, present status, maximum possibilities and limitations", Nuclear Instruments and Methods in Physics Research Section A: Accelerators, Spectrometers, Detectors and Associated Equipment, vol. 567, Jun. 27, 2006, pp. 70-73, ISSN: 0168-9002.

(Continued)

*Primary Examiner* — Ermias Woldegeorgis
(74) *Attorney, Agent, or Firm* — Thomas E. Loop

(57) ABSTRACT

The invention is directed to an avalanche photodiode containing a substrate and semiconductor layers with various electrophysical properties having common interfaces both between themselves and with the substrate. The avalanche photodiode may be characterized by the presence in the device of at least one matrix consisting of separate solid-state areas with enhanced conductivity surrounded by semiconductor material with the same type of conductivity. The solid-state areas are located between two additional semiconductor layers, which have higher conductivity in comparison to the semiconductor layers with which they have common interfaces. The solid-state areas are generally made of the same material as the semiconductor layers surrounding them but with conductivity type that is opposite with respect to them. The solid-state areas may be made of a semiconductor with a narrow forbidden zone with respect to the semiconductor layers with which they have common interfaces.

4 Claims, 1 Drawing Sheet

(56) References Cited

OTHER PUBLICATIONS

Z. Sadygov et al., "Avalanche Semiconductor Radiation Detectors", Jun. 1996, IEEE Transactions on Nuclear Science, vol. 43, No. 3, pp. 1009-1013.

Z. Sadyigov [sic] et al., "The Investigation of Possibility to Create the Multichannel Photodetector Based on the Avalanche MRS-Structure", 1991, SPIE vol. 1621 Optical Memory and Neutral Networks, pp. 158-168.

Sadygov, Ziraddin, "Three advanced designs of avalanche micropixel photodiodes: their history of development, present status, maximum possibilities and limitations", Jun. 23, 2005, 4th International Conference on New Developments in Photodetection, Beaune, pp. 1-23 (relevant pp. 8, 9, and 13), published on internet at http://npid.in2p3.fr/beaune05/cdrom/Sessions/Sadygov.pdf.

* cited by examiner

મicroCHANNEL AVALANCHE
PHOTODIODE (VARIANTS)

CROSS REFERENCE TO RELATED
APPLICATIONS

This application claims the benefit of U.S. Provisional Application No. 60/890,750 filed on Feb. 20, 2007, incorporated herein by reference in its entirety for all purposes.

FIELD OF THE INVENTION

The invention relates to semiconductor photosensitive devices and specifically to semiconductor avalanche photodiodes with internal amplification of the signal. The proposed microchannel avalanche photodiode can be used for registration of super feeble light pulses, including up to individual photons, and also gamma quants and charged particles in devices for medical gamma tomography, radiation monitoring, and nuclear physics experiments.

BACKGROUND OF THE INVENTION

A device is known (Gasanov, A. G. et al., Patent of the Russian Federation No. 1702831 issued Jun. 27, 1997, which includes a semiconductor substrate and a matrix of semiconductor areas that have conductivity type opposite that of the substrate and that are separated from the translucent field electrode by a buffer—resistive layer with specific conductivity. Avalanche amplification of the photoelectrons takes place on the boundaries between the substrate and the semiconductor areas. The avalanche current then flows to the translucent electrode through the resistive layer situated above these areas. A shortcoming of this device is the low quantum output in the visible and ultraviolet areas of the spectrum due to the poor transparency of both the buffer layer and the highly doped semiconductor areas. In addition, there is no possibility that the photoelectrons formed between the semiconductor areas can be amplified, which leads to a reduction in the sensitivity of the device.

A device is known (Antich P. P. et al., U.S. Pat. No. 5,844,291 issued Dec. 1, 1998), which includes a semiconductor substrate with n-type conductivity and an epitaxial layer with p-type conductivity separated from the substrate by a resistive layer and a dielectric layer. Separate semiconductor areas with n-type conductivity are formed inside the dielectric layer and exit on the one side at the resistive layer and on the other—at the epitaxial layer. Highly doped areas with n-type conductivity ensure localization of the avalanche process in the p-n junctions separated one from the other by areas of the dielectric layer. The photosensitive layer where the photoelectrons are formed is actually the epitaxial layer grown on the surface of heterogeneous materials—dielectric and resistive layers. That is why the main shortcomings of the device are the complexity of the technology of preparing such epitaxial layers and the high level of dark current, which leads to deterioration of the sensitivity, and the signal-to-noise ratio of the device.

A lastly, a device is also known (Sadygov Z. Y., Patent of Russia No. 2102821 issued Jan. 20, 1998), which has been taken as a prototype and which includes a semiconductor substrate and a semiconductor layer forming a p-n junction with the substrate. The surface of the substrate contains a matrix of separate semiconductor areas with enhanced conductivity compared to that of the substrate. In the prototype, the semiconductor areas are used with the purpose of creating separate avalanche areas (micro-channels) that ensure amplification of the signal. A shortcoming of the device is the presence—and also the formation in the process of operation—of uncontrollable local micro-sparkovers in the interface regions where amplification of the photoelectrons is taking place. The problem here is that the semiconductor areas are located immediately on the p-n junction interface formed on the substrate—semiconductor layer interface. That is why the semiconductor areas have a charge and current connection between them or through the electrically neutral part of the semiconductor layer or through the substrate depending on the conductivity type. In other words, the device does not have implemented local limitation of the current in the separate areas where the avalanche process is taking place. The one or several areas with decreased sparkover potential do not permit an increase in the device voltage in order to attain a high level of the avalanche process over the whole area of the device. In this way, the device has a limited factor of amplification of the avalanche process, which is an indicator of the sensitivity level of the avalanche photodiode.

SUMMARY OF THE INVENTION

In brief, the present invention is directed to an avalanche photodiode containing a substrate and semiconductor layers with various electro-physical properties having common interfaces both between themselves and with the substrate. The avalanche photodiode may be characterized by the presence in the device of at least one matrix consisting of separate solid-state areas with enhanced conductivity surrounded by semiconductor material with the same type of conductivity. The solid-state areas are located between two additional semiconductor layers, which have higher conductivity in comparison to the semiconductor layers with which they have common interfaces. The solid-state areas are generally made of the same material as the semiconductor layers surrounding them but with conductivity type that is opposite with respect to them. The solid-state areas may be made of a semiconductor with a narrow forbidden zone with respect to the semiconductor layers with which they have common interfaces. The solid-state areas are made of a metal material.

Stated somewhat differently, the characteristic feature of the proposed device is that in the avalanche photodiode containing a substrate and semiconductor layers with various electro-physical properties having common interfaces both between themselves and with the substrate, at least one two-dimensional matrix of separate solid-state areas—islets with enhanced conductivity for the creation of potential micro-holes is formed. In order to reduce the generation current in the volume and to improve the homogeneity of the distribution of the potential along the surface of the device, the solid-state areas are situated between two additional semiconductor layers having enhanced conductivity with respect to the semiconductor layers with which they have common interfaces. As a result, such form of distribution of the potential in the volume of the device is achieved, which ensures the gathering of the photoelectrons towards the separate solid-state areas where avalanche amplification of the charge carriers with their subsequent accumulation in the corresponding micro-holes is taking place. The charge accumulated in the micro-holes decreases the electric field in the avalanche area, which leads to self-extinguishing of the avalanche process. Then the charge carriers flow to the contacts, thanks to sufficient leakage in the micro-holes.

In this way, amplification of the photoelectrons takes place in independent multiplication channels with subsequent self-extinguishing of the avalanche process. Thanks to that, the stability of the amplitude of the photo-response is improved and the sensitivity of the photodiode is increased.

DETAILED DESCRIPTION OF THE INVENTION

The present invention is aimed at improving the stability of the signal amplitude and increasing the sensitivity of the avalanche photodiode in the visible and ultraviolet regions of the spectrum. In order to achieve these technical results, at least one matrix consisting of separate solid-state areas with enhanced conductivity surrounded on all sides by semiconductor material with one type of conductivity is formed in the avalanche photodiode that includes a semiconductor substrate and semiconductor layers with various electrophysical parameters. The solid-state areas are located between two additional semiconductor layers, which have enhanced conductivity in comparison to the semiconductor layers with which they have a common interface. Moreover, at least one of the additional semiconductor layers with enhanced conductivity does not have a common interface with the solid-state areas. The semiconductor areas are located along the common interface of the semiconductor layers.

Depending on the variant of implementation of the device, the solid-state areas with enhanced conductivity are formed of material, which is the same as that of one of the semiconductor layers but with a different type of conductivity, of narrow zone semiconductor with regard to the material of the semiconductor layers, and also of metal material. This leads to the formation in the device of either alternating p-n junctions, or heterojunctions, or metal-semiconductor junctions in a direction perpendicular to the substrate plane.

As a result, at least one two-dimensional matrix of separate potential holes located between the additional semiconductor layers with enhanced conductivity is formed in the device. The formation of two and more matrices of solid-state areas with enhanced conductivity leads to great improvement of the sensitivity and stability of the signal amplitude of the device.

Figure 1A:
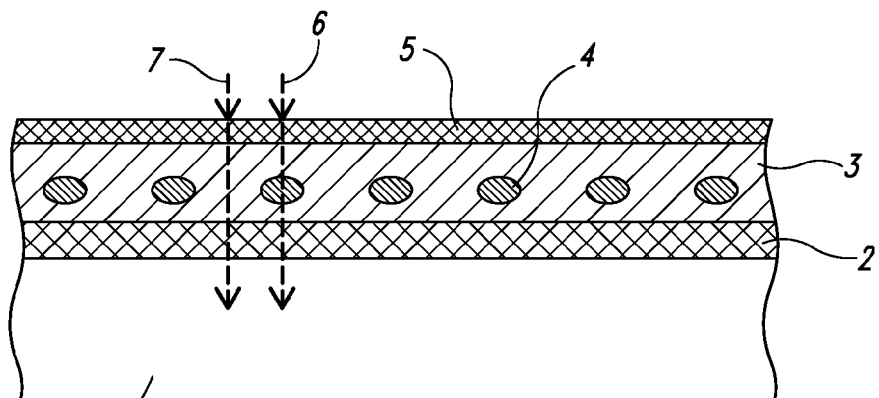
FIGS. 1A-C represent side cross-sectional views of an avalanche photodiode in accordance with an embodiment of the present invention.
Figure 1B:
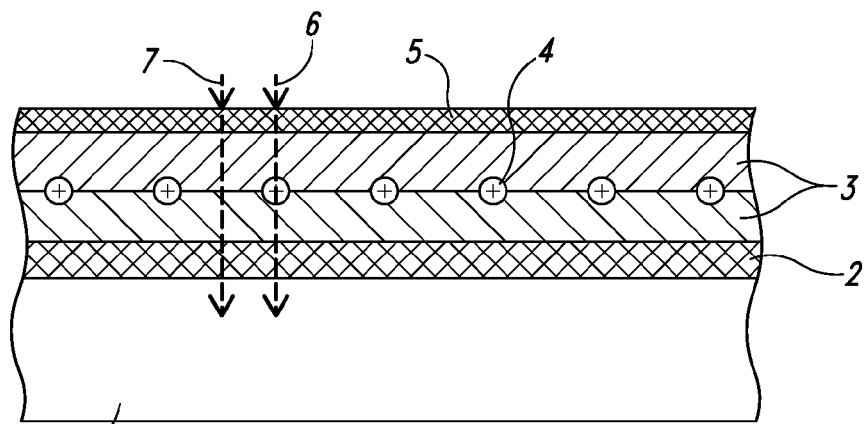
Figure 1C:
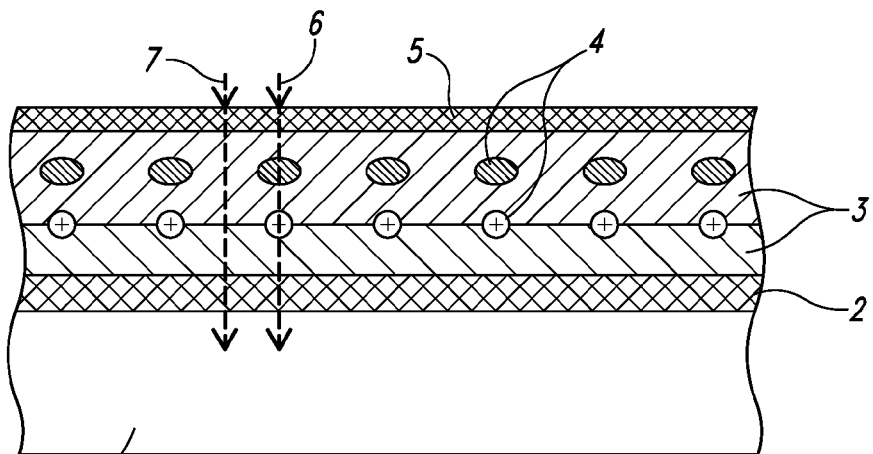

The invention is illustrated in FIGS. 1A-C, where the cross sections of the micro-channel avalanche photodiode with sample A and sample C matrices of the solid states areas located between the additional semiconductor layers with enhanced conductivity are shown. The device is manufactured on a base of a semiconductor substrate 1, for example silicon with n-type conductivity and a resistivity of 1 Ωcm. At the beginning, the first additional semiconductor layer 2 with n-type conductivity and a resistivity of 0.1 Ωcm is formed in the work area of the semiconductor substrate by means of local diffusion doping with phosphorus. Then a silicon semiconductor layer 3 with p-type conductivity and resistivity in the range of 1-100 Ωcm forming a p-n junction with the first additional semiconductor layer is grown on the surface of the substrate by means of molecular epitaxy. The solid-state areas with enhanced conductivity 4 are formed by means of ion-doping of the semiconductor layer with phosphorus atoms. The doping dose is selected in the 5-100 μCi/cm² range. After annealing the defects at a temperature of 900° C., areas or islets with n-type conductivity and a resistivity of about 0.01 Ωcm surrounded on all sides by semiconductor material with p-type conductivity and resistivity in the 1-100 Ωcm range are formed in the semiconductor layer. Then a second additional semiconductor layer 5 with a resistivity of about 0.01 Ωcm is formed on the surface of the semiconductor layer 3 by means of ion-doping with boron. This leads to the formation in the volume of the device of alternating p-n junctions in direction 6, perpendicular to the substrate plane, whereby the alternating p-n junctions are located between the two additional semiconductor layers with enhanced conductivity.

Depending on the variant of implementation of the device, the solid-state areas with enhanced conductivity are formed also of germanium or titanium clusters surrounded by silicon material. In order that germanium or titanium clusters can be formed in the volume of the silicon semiconductor layer, the dose of doping agent with germanium or titanium is selected to be above 1000 μCi/cm². Then either alternating p-n junctions, or metal-semiconductor junctions in a direction perpendicular to the substrate plane, are formed in the device.

The cross-section dimensions of the solid-state areas and the clearance between them are determined by a special photo-template by means of which windows are opened in a photo-resist or in a special mask for local doping of the semiconductor layer. The energy of the ions in the process of doping is selected depending on the necessary depth of imbedding of the implanted atoms. Then the known components of the device as the protecting rings or the deep grooves around the work area as well as the contact electrodes are prepared.

Unlike the prototype, the avalanche amplification of the photocurrent in the proposed device takes place only in the boundaries of the solid-state areas with semiconductor layers, which represent by themselves independent channels of amplification of the charge carriers coinciding with direction 6. This occurs thanks to the fact that the areas with alternating potential barriers in direction 6 are surrounded by p-n junction areas located in direction 7. In operating mode, a voltage with polarity corresponding to the depletion of the semiconductor substrate from the main carriers of the charge is added to the top electrode of the semiconductor layer. When this happens, the middle junction in the multiplication channel becomes displaced in the forward direction and the two outside junctions—in the opposite direction. The p-n junction areas located between the multiplication channels also become displaced in the opposite direction. Moreover, the first additional semiconductor layer with enhanced conductivity limits spreading of the electric field in the substrate and in this way it ensures a decrease in the dark generation current and spreading of the avalanche process only in the work area of the device. The second additional semiconductor layer with enhanced conductivity limits the electric field from the external side and ensures homogeneity of the potential along the photosensitive surface of the device. As a result, a form of distribution of the potential inside the device is attained such that the gathering of the photoelectrons formed in the upper photosensitive semiconductor layer towards the potential micro-holes is stimulated. The amplification of the photoelectrons takes place in the first channel of multiplication from top to bottom, and the next junction displaced in the forward direction plays the role of a potential hole with a depth of about 0.5-1 V where the multiplied electrons gather. The accumulation of electrons in the above-mentioned potential hole for a time of several nanoseconds leads to a sharp decrease in the electric field in the avalanche area (i.e., in the boundary area of the first junction) and as a result of this the avalanche process in the given multiplication channel stops. Afterwards, for a time of several tens of nanoseconds after the discontinuation of the avalanche process, the accumulated electrons go into the substrate thanks to sufficient leakage of the third junction. In this way, avalanche amplification of the photoelectrons takes place in independent multiplication channels, which do not have a charge connection between themselves. Thanks to that, the stability of operation is improved and the sensitivity of the avalanche photodiode increases.

What is claimed is:

1. Avalanche photodiode containing a substrate and semiconductor layers with various electro-physical properties having common interfaces both between themselves and with the substrate, characterized by the presence in the device of at least one matrix consisting of separate solid-state areas with enhanced conductivity completely surrounded by semiconductor material with one and the same type of conductivity, whereby the solid state areas are located between two additional semiconductor layers, which have higher conductivity in comparison to the semiconductor layers with which they have common interfaces.

2. Avalanche photodiode in accordance with claim 1, distinguished by the following:
   the solid-state areas are made of the same material as the semiconductor layers surrounding them but with conductivity type that is opposite with respect to them.

3. Avalanche photodiode in accordance with claim 1, distinguished by the following:
   the solid-state areas are made of a semiconductor with a narrow forbidden zone with respect to the semiconductor layers with which they have common interfaces.

4. Avalanche photodiode in accordance with claim 1, distinguished by the following:
   the solid-state areas are made of a metal material.

* * * * *